US009123607B1

(12) United States Patent
Hatcher et al.

(10) Patent No.: US 9,123,607 B1
(45) Date of Patent: Sep. 1, 2015

(54) MODIFIED HYBRID INFRARED FOCAL PLANE ARRAY ARCHITECTURE FOR LARGE SCALING

(71) Applicant: LOCKHEED MARTIN CORPORATION, Bethesda, MD (US)

(72) Inventors: Ryan Michael Hatcher, Swarthmore, PA (US); Brent M. Segal, Pembroke, MA (US); Robert Chris Bowen, Mount Laurel, NJ (US); Jonathan Wesley Ward, San Jose, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 217 days.

(21) Appl. No.: 13/953,609

(22) Filed: Jul. 29, 2013

Related U.S. Application Data

(60) Provisional application No. 61/677,438, filed on Jul. 30, 2012.

(51) Int. Cl.
*H01L 27/146* (2006.01)
*H01L 51/00* (2006.01)

(52) U.S. Cl.
CPC ...... *H01L 27/14634* (2013.01); *H01L 27/1469* (2013.01); *H01L 27/14649* (2013.01); *H01L 51/0048* (2013.01)

(58) Field of Classification Search
CPC ............... H01L 27/14649; H01L 27/14652; H01L 27/14665; H01L 27/1467; H01L 27/14634; H01L 27/14636; H01L 51/0048
See application file for complete search history.

(56) References Cited

U.S. PATENT DOCUMENTS

| 4,943,491 | A | * | 7/1990 | Norton et al. ................. 428/620 |
| 5,665,959 | A | * | 9/1997 | Fossum et al. .............. 250/208.1 |
| 2008/0159042 | A1 | * | 7/2008 | Bertin et al. ............... 365/225.7 |
| 2013/0107344 | A1 | * | 5/2013 | Avouris et al. ................ 359/245 |

\* cited by examiner

*Primary Examiner* — Casey Bryant
(74) *Attorney, Agent, or Firm* — McDermott Will & Emery LLP (57) ABSTRACT

An apparatus for infrared imaging may include a hybrid infrared focal plane array including a front-end (FE) portion and a back-end (BE) portion. The FE portion may be coupled to the BE portion via multiple electrically conductive bump bonds. The FE portion may include nano-electronic circuits integrated with an array of infrared imaging pixels. The CNT electronic circuits may be configured to generate multiplexed output signals. The BE portion may include electronic circuits implemented on a substrate and configured to generate readout output signals. A count of the multiple electrically conductive bump bonds may be substantially less than a count of the infrared imaging pixels of the array.

20 Claims, 7 Drawing Sheets

MODIFIED HYBRID INFRARED FOCAL PLANE ARRAY ARCHITECTURE FOR LARGE SCALING

CROSS-REFERENCE TO RELATED APPLICATIONS

This application claims the benefit of priority under 35 U.S.C. §119 from U.S. Provisional Patent Application 61/677,438 filed Jul. 30, 2012, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to infrared detectors, and more particularly to a modified hybrid infrared focal plane array architecture for large scaling.

BACKGROUND

Modern infrared focal plane arrays (IRFPAs) may include a semiconductor infrared (IR) absorbing material and a readout integrated circuit (ROIC). Physically, the absorbing material may be a wafer of an exotic semiconductor such as indium antimonide (InSb) or mercury-cadmium-telluride (MCT), whereas the ROIC may be integrated with a silicon substrate. Because of the incompatibility of the silicon substrate and absorbing material, a bump bond process is typically employed to connect the FPA to the ROIC. A typical bump bonding process may use indium (In) bumps, each having a minimum diameter of ~15 microns, therefore, limiting the minimum feature size of the FPA. As an example, for mid-wave IR, pixel sizes may not be optically limited until well below 8 microns, but many IRFPA's have 15 micron pixels because 8 micron bumps may not yield well. Furthermore, there may be at least one bump bond for every pixel in an IRFPA through which the photocurrent from each pixel in the absorbing material can be collected in the ROIC. Because of these constraints, the largest IRFPA currently may be limited to about 10 million pixels. As a result, there is a need for design concepts for small size arrays with high radiation performance.

SUMMARY

In some aspects, an apparatus for infrared imaging may include a hybrid infrared focal plane array including a front-end (FE) portion and a back-end (BE) portion. The FE portion may be coupled to the BE portion via multiple electrically conductive bump bonds. The FE portion may include nano-electronic circuits integrated with an array of infrared imaging pixels. The nano-electronic circuits may be configured to generate multiplexed output signals. The BE portion may include electronic circuits implemented on a substrate and configured to generate readout output signals. A count of the multiple electrically conductive bump bonds may be substantially less than a count of the infrared imaging pixels of the array.

In other aspects, a method for providing a hybrid infrared focal plane array may include providing a FE portion comprising nano-electronic circuits integrated with an array of infrared imaging pixels and generating multiplexed output signals. A BE portion including electronic circuits implemented on a substrate and generating readout output signals may be provided. The FE portion may be coupled to the BE portion via multiple electrically conductive bump bonds. A count of the multiple electrically conductive bump bonds may be substantially less than a count of the infrared imaging pixels of the array.

In other aspects, a device for infrared imaging may include an infrared focal plane array (IUM) integrated with nano-electronic circuits forming a FE plane and configured to generate multiplexed output signals corresponding to a plurality of pixels. A CMOS electronic circuit back-end (BE) plane may be configured to receive the multiplexed output signals and to generate readout output signals. Multiple electrically conductive bump bonds may be configured to couple the FE plane to the BE plane. The count of the multiple electrically conductive bumps may be proportional to a square root of the count of the plurality of pixels.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The present disclosure is directed, in part, to methods and configurations for reducing the number of bump bonds per pixel through the use of nano-technology devices including carbon nanotube (CNT) field-effect transistor (FET), graphene FET, and organic FET. The subject technology is generally directed to infrared imaging, and more particularly to a modified hybrid infrared focal plane (IRFPA) architecture for large scaling. In some aspects, the CNT FET technology may be applied as part of the readout integrated circuit (ROIC) in the IRFPA to reduce the number of bump bonds, thus increasing the pixel density of the IRFPA. In one or more aspects, an IRFPA may be integrated with nano-technology devices on the absorber material to electrically interface multiple pixels (e.g., front-end of the ROIC) and couple to the back-end of the ROIC to drive the FPA.

In some aspects of the present technology, an architecture is proposed that can significantly reduce the number of required bump bonds per pixel. This may be accomplished through the integration of nano-technology on the absorber as part of the readout integrated circuit (ROIC). To the first order, the disclosed architecture may only require a number of bump bonds equal to twice the square root of the number of pixels in the array. For example, an IRFPA with a 100 million pixel array may only require about 20,000 bump bonds. The disclosed architecture may also eliminate the restriction on the size of each pixel. This may allow IRFPA designers to choose to make pixels as small as possible. Through integration of nano-technology devices onto the absorber material, the disclosed architecture may also enable higher density bi-color or multi-color FPAs. Existing bi-color FPAs may require two bump bonds per pixel, which may further restrict the size of the FPA.

The current approach is to improve the same architecture by shrinking the bump bonds and increasing bump bond yields. The other approach is to stack together multiple IRFPAs to get a large format, which may become problematic near the edges of the individual IRFPAs. Both of these techniques can only provide limited improvement in the density of the FPAs, whereas the disclosed technology may improve the FPA density much more significantly An advantage of nano-technology devices may include the ability to deposit and integrate the nano-technology devices on a wide range of substrates including semiconductor substrates such as silicon, GaAs, GaN, or flexible substrates, which may not be possible with other technologies, such as complementary-symmetry metal-oxide-semiconductor (CMOS) technology (e.g., Si CMOS). Further, the small feature size of nano-technology devices, the potential to stack multiple nano-technology devices vertically, and the improved device yields (which may in turn reduce production costs) are among other advantages of the nano-technology devices.

Figure 1A:
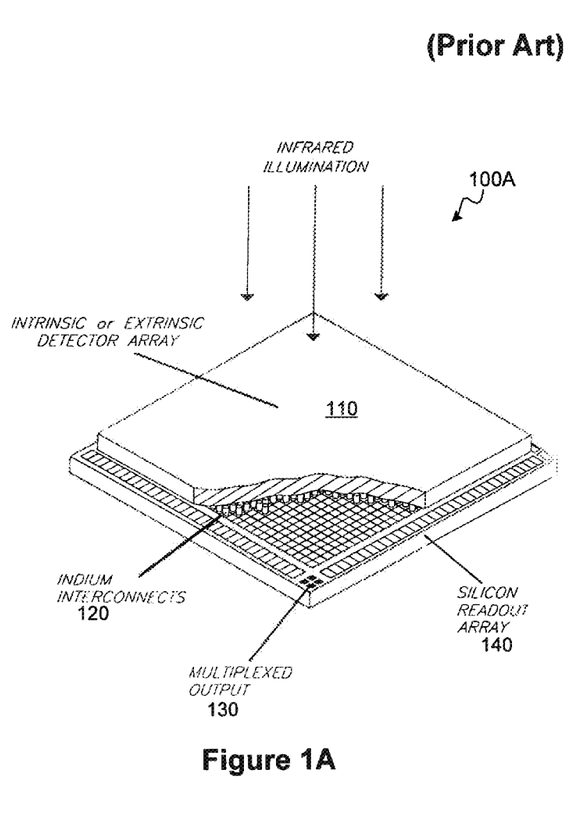
FIGS. 1A-1C are diagrams illustrating various views of an array structure of an infrared imaging apparatus.
Figure 1B:
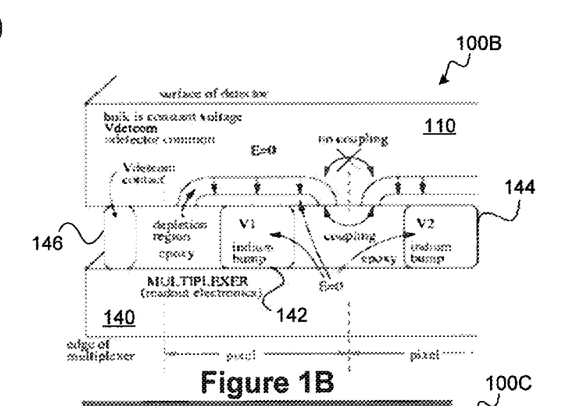
Figure 1C:
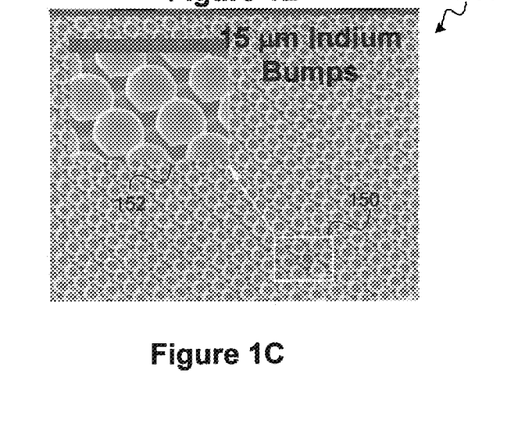

FIGS. 1A-1C are diagrams illustrating various views 100A-C of an array structure of an infrared imaging apparatus. FIG. 1A shows a top-view 100A of the infrared imaging apparatus that includes a detector array 110 (e.g., intrinsic or extrinsic), made of an infrared absorbing material, coupled via a number of indium interconnects 120 to a silicon readout array 140. The incident infrared photons, upon interaction with the detector array 110 can produce electronic charges (e.g., photo-current) that can generate corresponding electronic signals that are transferred through the indium interconnects 120 to the silicon readout array 140, where electronic signals are readout via a multiplexed output 130.

FIG. 1B shows a side-view 100B of a portion of the infrared imaging apparatus of FIG. 1A. In the side view 100B, two indium interconnects 142 in the form of bumps are shown to couple two pixels of the detector array (e.g., a semiconductor detector array) 110 to the readout electronics 140. The detector array 110 is biased via a detector common voltage, which is applied via an interconnect 146. The common voltage applied to the detector array may produce a depletion layer associated with each pixel, which forms the active region of the pixel where photocurrents produced upon interaction of the infrared photons can be collected. The gap between the depletion regions may be smaller in fully biased detectors, and may exhibit nonlinear inter-pixel coupling that decreases as the pixel accumulates charge and the inter-pixel gap widens.

FIG. 1C depicts a top-view 100C of a portion of the infrared imaging apparatus of FIG. 1A under the detector 110 array showing indium interconnects. The portion 152 is a blown up view of the portion 150 and shows the columnar structure of the indium bumps. The diameter of each indium bump may be approximately 15 µm, which in turn limits the size of a pixel of the detector array 110 to more than 15 µm.

Figure 2:
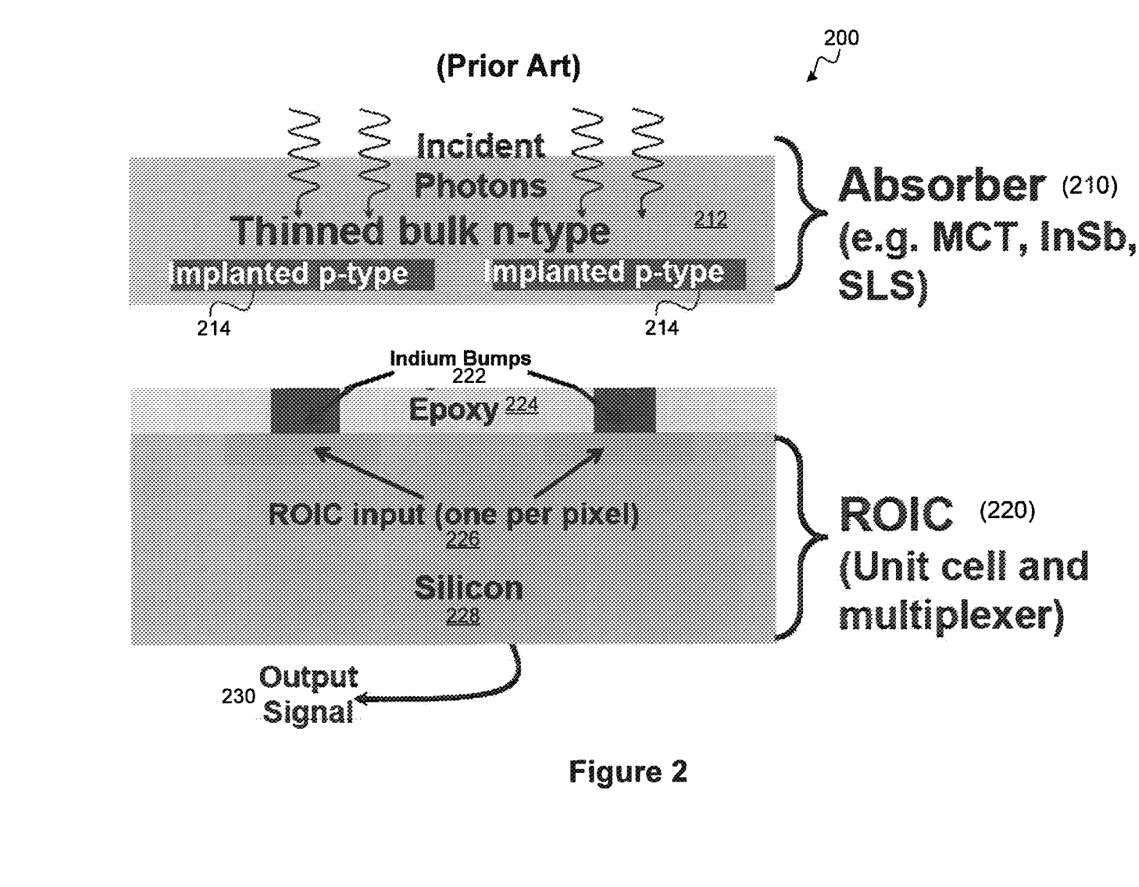
FIG. 2 is a diagram illustrating a side-view of a structure of a two-pixel portion of an infrared imaging apparatus.

FIG. 2 is a diagram illustrating a side-view 200 of a structure of a two-pixel portion of an infrared imaging apparatus. The side-view 200 shows an absorber portion 210 and an ROIC portion 220. The absorber portion 210 may be formed by IR absorbing materials such as mercury-cadmium-telluride (MCT), indium antimonide (InSb), or sodium lauryl sulfate (SLS). The bulk of the absorber 210 may comprise a thinned n-type material 212 and the contacts 214 may be formed by implant p-type material 214. The ROIC portion 220 may include ROIC inputs 226 (e.g., one per pixel) embedded in a substrate 228 (e.g., a semiconductor substrate such as silicon, GaAs, GaN, or a flexible substrate) that also includes a number of multiplexers. The indium bumps 222 are formed on the ROIC inputs 226 for individual pixels and are isolated from one another by an epoxy layer 224.

It is understood that a traditional 25 Mpixel FPA may need 25,000,000 bump bonds, e.g., one per each pixel. Considering the 15 µm size of each bump bond, this makes the size of the 25 Mpixel FPA unacceptably large, therefore, limiting the number of pixels in the detector array to less than 10 million. The architecture of the subject technology may eliminate the need for one bump bond for each pixel (linear scaling) and instead may require a number of bump bonds roughly equal to twice the square root of the number of pixels (i.e., scales as the square root of the number of pixels). Further, the size of IRFPAs may not be limited by the ability of manufactures to yield bump bonds. The proposed approach may also eliminate the size of the bump bond as a lower limit to the size of a pixel.

Figure 3:
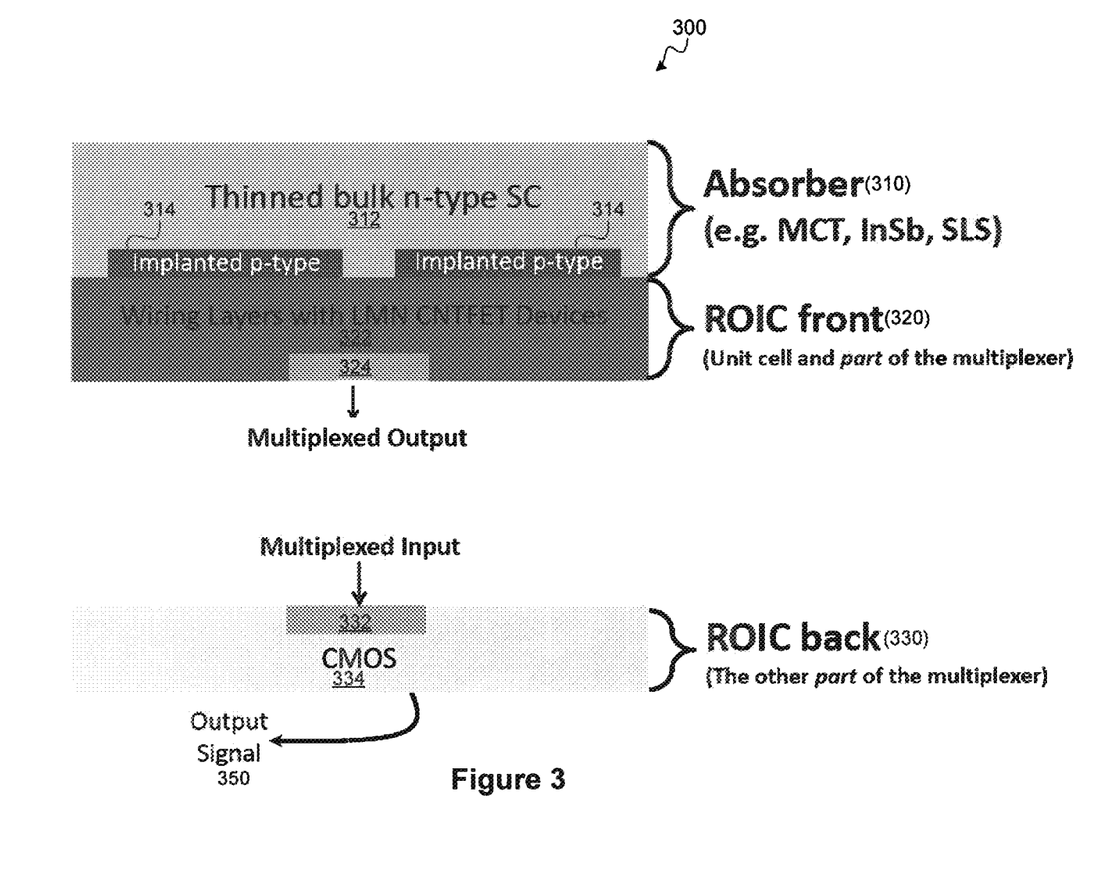
FIG. 3 is a diagram illustrating a side-view of a portion of a hybrid infrared focal plane array, according to certain aspects.

FIG. 3 is a diagram illustrating a side-view 300 of a portion of a hybrid IRFPA, according to certain aspects of the subject technology. The side-view 300 shows an absorber portion 310, a front-end ROIC 320, and a back-end ROIC 330. The absorber portion 310 may include a thinned bulk of a semiconductor 312 (e.g., an n-type semiconductor such as MCT, InSb, or SLS) with embedded contacts 314 (e.g., implanted p-type contacts). The hybrid IRFPA architecture shown in FIG. 3 can reduce the number of required bump bonds per pixel significantly. This is accomplished through the integration of the nano-technology devices, as part of the front-end ROIC, with the absorber. In the architecture shown in FIG. 3, part of the functionality of the ROIC is moved from the CMOS into the wiring layers 322 of the absorbing material. In some aspects of the disclosed technology, the ROIC may comprise two portions, the front-end ROIC 320 and the back-end ROIC 330. The front-end ROIC 320 may include one unit cell per pixel and a half (e.g., a front-half) of a multiplexer (not shown here for simplicity). The back-end ROIC 330 may include another half (e.g., a back-half) of the multiplexer and other drive circuitry for supporting the front-end ROIC 320. In one or more aspects, the front-end ROIC 320 may be built directly into the wiring layers 322 of the absorber material. The back-end ROIC 330 may remain in the silicon CMOS portion 334 and the output signal 350 may be derived from the silicon CMOS portion 334.

The two halves of the multiplexer are shown separately for clarity, however, in practice the two halves are properly coupled together. For example, the two halves of the multiplexer may be coupled together through a conductive interconnect, such as a conductive bump bond (e.g., indium bump bond) that connects the contacts 324 and 332 together. The contacts 324 and 332 are embedded in the wiring layers 322 of the absorber material and the silicon CMOS 334, respectively. The substantial reduction of the number bump bonds per pixel of the hybrid IRFPA architecture shown in FIG. 3 is due to the fact that the signals from a number of pixels can be multiplexed by the front half of the multiplexer and coupled via a single bump bond to the back half of the multiplexer. For the architecture of FIG. 3 a number of bump bonds may equal to twice the square root of the number of pixels in the IRFPA. For example, an IRFPA with a 100 million pixel array may only use about 20,000 bump bonds, which is a drastic reduction in the number of bump bonds, and can translate into a substantially more compact IRFPA with significantly higher number of pixels. For instance, the disclosed architecture may eliminate the restriction on the size of each pixel. This may enable the disclosed IRFPA to be built with pixels as small as the technology allows.

Through integration of the nano-technology devices onto the absorber material, the proposed architecture may also enable higher density bi-color or multi-color IRFPAs. The standard bi-color FPAs may require two bump bonds per pixel that further restricts the size of the IRFPAs. As stated above, an advantage of creating a nano-technology front-end ROIC is the ability to stack multiple FETs without the additional need of underlying Si CMOS area.

Using the nano-technology in the front-end ROIC 320 may also be beneficial for the creation of dual band and bicolor FPAs, for example, by addressing two different bands with two input stages designed in the same pixel. Using a standard absorber-ROIC architecture, two bumps per pixel may be required. With a nanotechnology (e.g., CNT FET) front-end ROIC, the readout multiplexing can be performed directly on the absorber so that at most one bump per pixel may be required. It may also be possible to fabricate a multi-colored or multi-band FPA by utilizing nano-technology front-end ROIC. As another potential aspect, using nano-technology devices for the ROIC can also permit the fabrication of flexible FPAs that can be attached to many surfaces, such as the wings of an unmanned aerial vehicle (UAV) or a helmet of a war fighter.

Figure 4A:
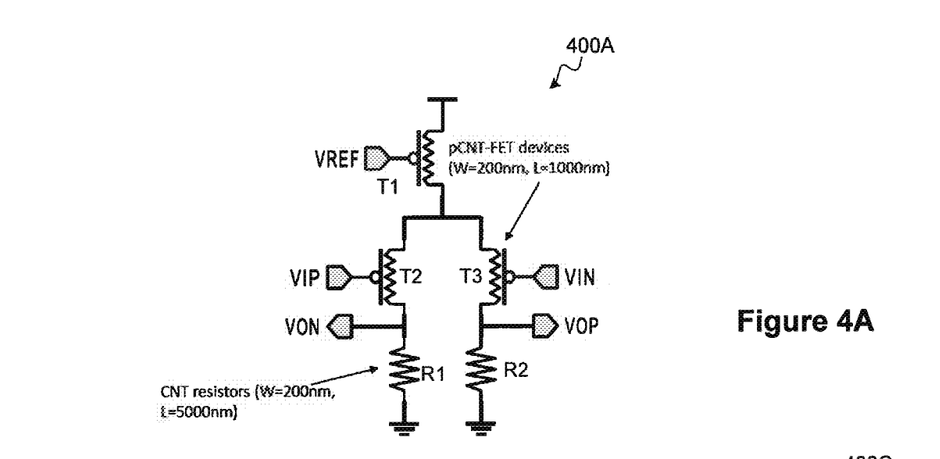
FIGS. 4A-4C are diagrams illustrating an example nano-material based amplifier and corresponding transfer function and I-V characteristic, according to certain aspects.
Figure 4B:
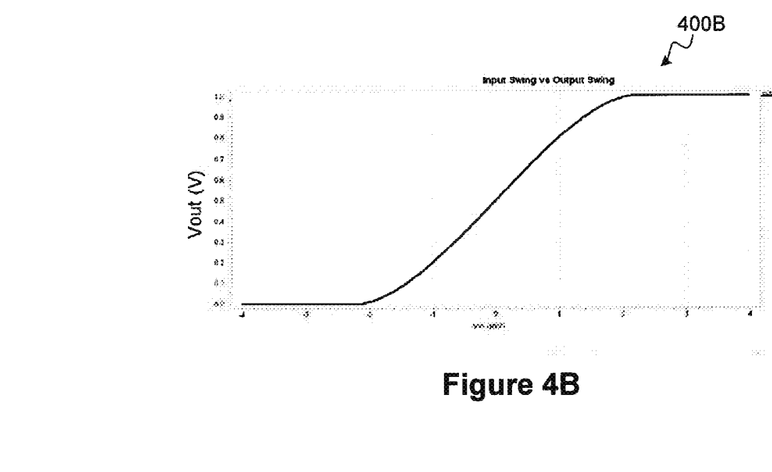
Figure 4C:
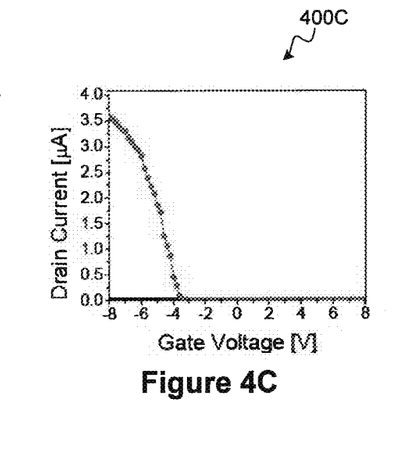

FIGS. 4A-4C are diagrams illustrating an example nano-material based amplifier 400A and corresponding transfer function 400B and I-V characteristic 400C, according to certain aspects of the subject technology. The amplifier 400A is an analog amplifier (e.g., a differential amplifier) in which transistors T1-T3 and resistors R1 and R2 may be formed by using nano-technology (e.g., CNT FET, graphene FET, and organic FET technology). For example, the CNT FET is distinguished from the standard FET by the fact that the silicon channel in the CNT FET is replaced by CNT channel, which can overcome channel length limitations of the silicon channel. The operational performance of the amplifier 400A may be equivalent to a CMOS amplifier. Further, the amplifier 400A may be fabricated using standard semiconductor fabrication equipment. The transfer function 400B shown in FIG. 4B depicts the input-voltage swing versus output-voltage swing and indicates a substantially linear region that extends from around −1.5V to approximately +1.5V. The I-V characteristic 400C of FIG. 4C shows a characteristic of a switch with a current ON/OFF ratio of approximately 479000:1. The CNT FETs used in the amplifier 400A may have a sub-threshold swing of about 333 mV/dec.

Figure 5:
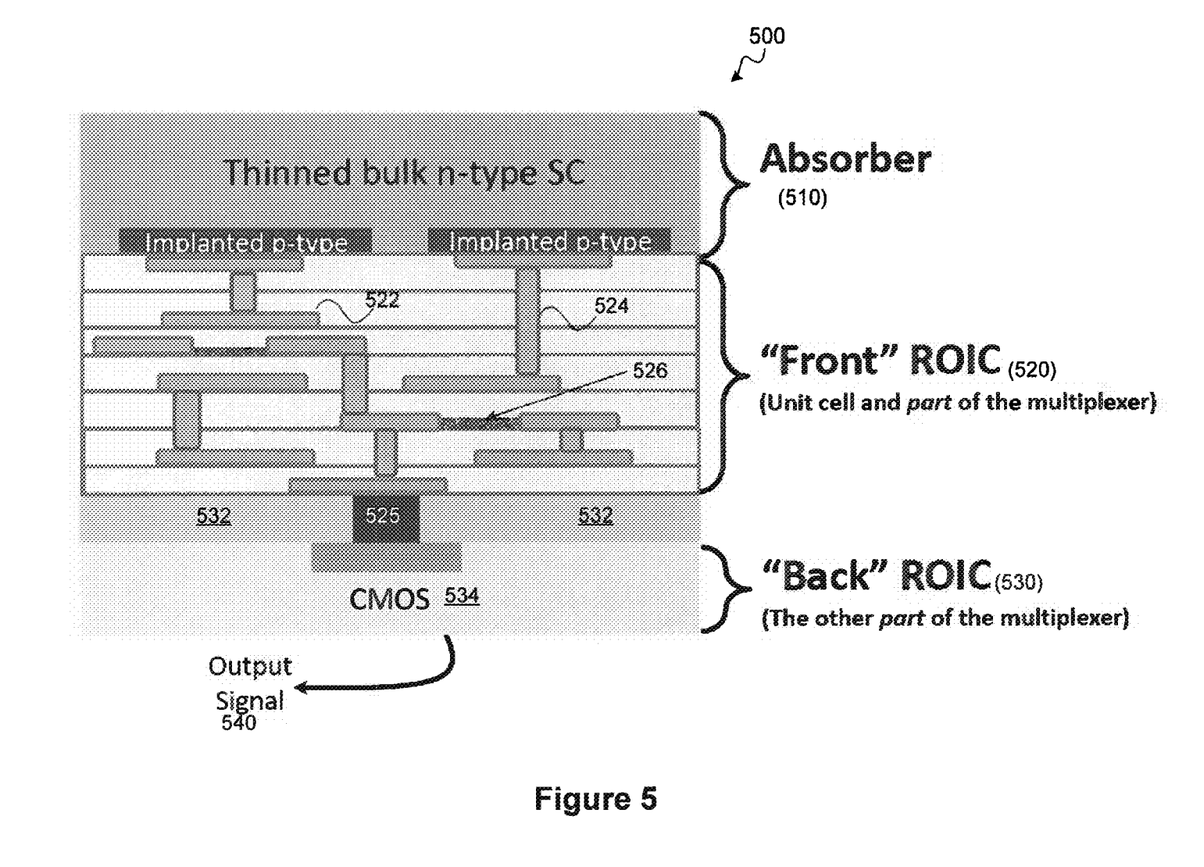
FIG. 5 is a diagram illustrating a side-view of a portion of a hybrid infrared focal plane array, according to certain aspects, according to certain aspects.

FIG. 5 is a diagram illustrating a side-view 500 of a portion of a hybrid IRFPA, according to certain aspects of the subject technology. The hybrid IRFPA, the side-view 500 of which is shown in FIG. 5, is in some aspects similar to the hybrid IRFPA of FIG. 3. For example, the absorber 510 and the back-end ROIC 530 may be similar to the absorber 310 and the back-end ROIC 330 of FIG. 3. The side-view 500, however, shows an example structural detail of the front-end ROIC 520, which is different from the front-end ROIC 320 of FIG. 3. In the front-end ROIC 520, the front half of the multiplexer is implemented, at least partially, by using the nano technology material (e.g., CNT FET, organic FET, or graphene FET) that allows a multi-level (e.g., vertically stacked) structure. The multi-level structure may enable fabrication of more complex circuitry in a more compact structure. Stacking the FET devices (e.g., CNT FET, organic FET, or graphene FET) may permit the creation of large readout circuits without having to stack multiple chips together. The stacking of the FET devices may also open up additional functionality (e.g., on-chip A/D converters which are currently integrated off-chip) in the back-end ROIC 330 by creating additional usable area within the substrate.

The vias 524 which interconnect structures of different levels may be fabricated using metals or CNT. The interconnects 522 may form parts of the transistors with CNT channels 526. In some implementations, the interconnects 522 may be fabricated by using nano technology. The bump bond (e.g., indium) 525 surrounded by epoxy 532 may interface the front half of the multiplexer with the back half of the multiplexer, which is implemented in CMOS (e.g., silicon CMOS) portion 534 of the back-end ROIC 530. The output signal 540 of the hybrid IRFPA is derived from the CMOS portion 534.

Figure 6A:
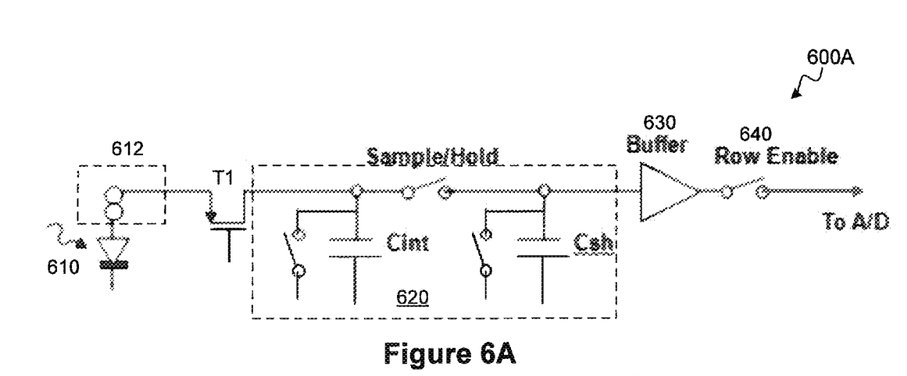
FIGS. 6A-6B are diagrams illustrating an example nano-electronic circuit integrated with a pixel of a hybrid infrared focal plane array and a top-view of the hybrid infrared focal plane array, according to certain aspects.
Figure 6B:
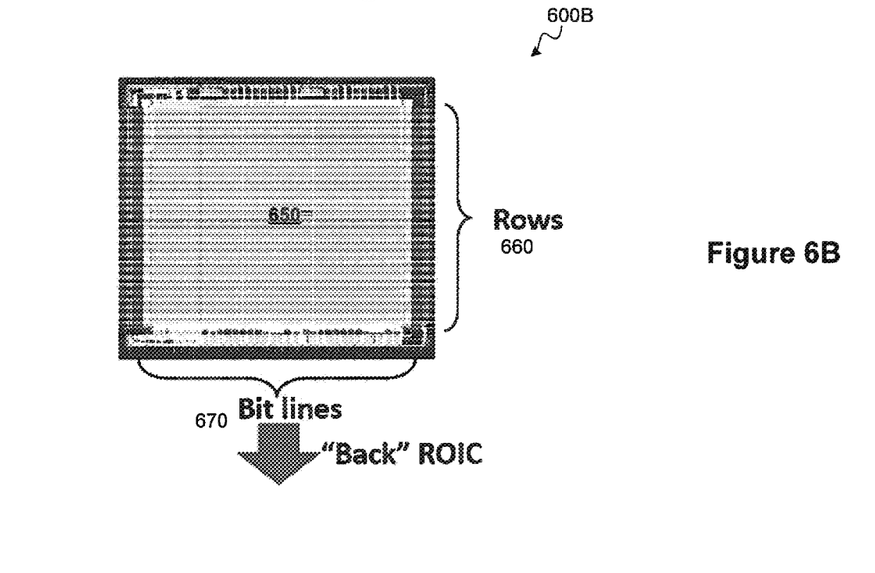

FIGS. 6A-6B are diagrams illustrating an example nano-electronic circuit 600A integrated with a pixel of a hybrid IRFPA and a top-view 600B of the hybrid IRFPA, according to certain aspects of the subject technology. The nano-electronic circuit 600A represents a unit cell of the front-end ROIC circuit and includes an IR sensor 610 (e.g., a pixel of the hybrid IRFPA), a trans-impedance amplifier 612, a front switch transistor T1, a sample and hold block 620, a buffer 630, and a row enable switch 640, which can be fabricated, fully/partially, by using nano technology (e.g., CNT technology). The capacitors Cint and Csh are integration and sample/hold capacitors.

The hybrid IRFPA may be formed as a two dimensional array, and each pixel may be associated with a row and a column address. The row address associated with a pixel (e.g., IR sensor) 610, once applied may enable (e.g., close) the row enable switch 640 to allow a sample of the output of the pixel 610 to appear at an input port of an analog-to-digital (A/D) converter. In some aspects, the A/D converter may also be integrated with the front-end ROIC. The pixel 610 may be a pixel of the example hybrid IRFPA 650 shown by the top-view 600B. The example hybrid IRFPA 650 may include multiple (e.g., 660) rows and multiple (e.g., 670) columns (e.g., bit lines), which amounts to more than about 442000 pixels. It is understood that significantly larger FPAs with substantially higher number of pixels can be fabricated by using the subject technology. The front-half of the multiplexer may scan the IRFPA 650 row-by-row, collect signals from individual bit-lines in parallel, and pipe each bit line to the back-end ROIC.

Figure 7:
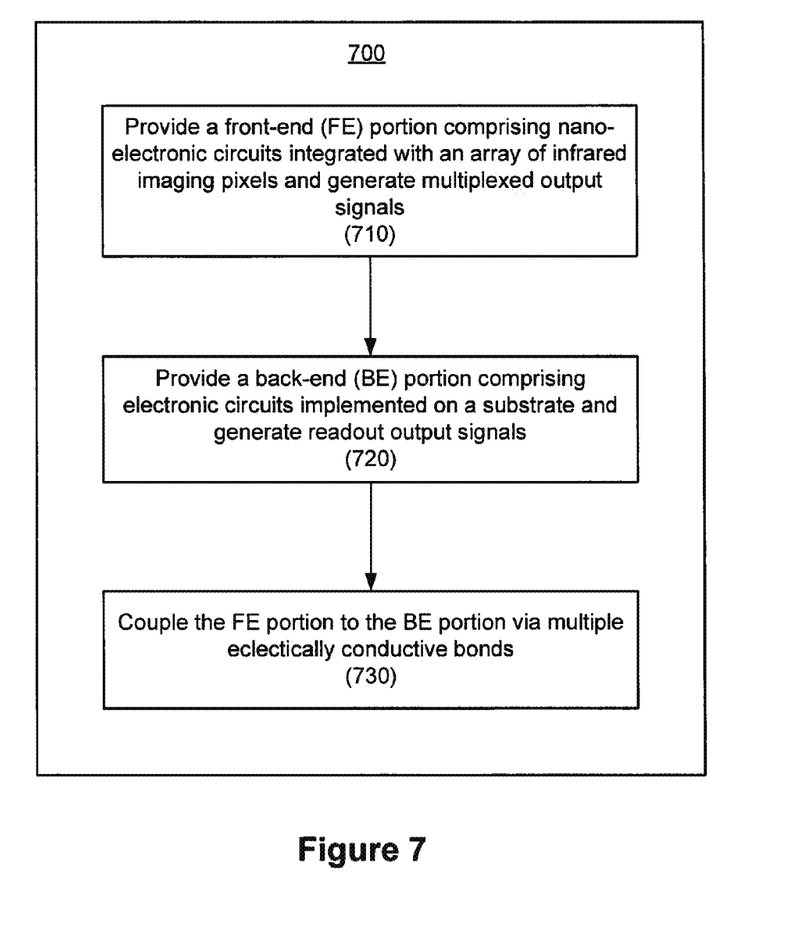
FIG. 7 is a flow diagram illustrating an example method for providing a hybrid infrared focal plane array, according to certain aspects.

FIG. 7 is a flow diagram illustrating an example method 700 for providing a hybrid infrared focal plane array, according to certain aspects of the subject technology. The method 700 begins at operation block 710, where a front-end (FE) portion (e.g., 320 of FIG. 3 or 520 of FIG. 5) including nano-electronic circuits integrated with an array of infrared imaging pixels (e.g., 650 of FIG. 6) may be provided, and multiplexed output signals (e.g., at 324 of FIG. 3) are generated. At operation block 720, a back-end (BE) portion (e.g., 330 of FIG. 3 or 530 of FIG. 5) comprising electronic circuits may be implemented on a substrate (e.g., 334 of FIG. 3 or 534 of FIG. 5) and readout output signals (e.g., 350 of FIG. 3 or 540 of FIG. 5) may be generated. At operation block 730, the FE portion may be coupled to the BE portion via multiple electrically conductive bump bonds (e.g., 525 of FIG. 5). A count of the multiple electrically conductive bumps may be substantially less than a count of the infrared imaging pixels of the array.

In some aspects, the subject technology is related to infrared imaging, and more particularly to modified hybrid infrared focal plane architecture for large scaling. In some aspects, the subject technology may be used in various markets, including for example and without limitation, advanced sensors, optical components, and semiconductor markets.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An apparatus for infrared imaging, the apparatus comprising:
    a hybrid infrared focal plane array that comprises a front-end (FE) portion and a back-end (BE) portion, the FE portion being coupled to the BE portion via a plurality of electrically conductive bump bonds;
    the FE portion comprising nano-electronic circuits integrated with an array of infrared imaging pixels and configured to generate multiplexed output signals;
    the BE portion comprising electronic circuits implemented on a substrate and configured to generate readout output signals;
    wherein a count of the plurality of electrically conductive bumps is substantially less than a count of the infrared imaging pixels of the array.

2. The apparatus of claim 1, wherein the array of infrared imaging pixels comprises an infrared absorbing material comprising one or more of mercury-cadmium-telluride (MCT), indium antimonide (InSb), or sodium lauryl sulfate (SLS).

3. The apparatus of claim 2, wherein the infrared absorbing material comprises a bi-color absorbing material, and wherein the infrared absorbing material comprises a dual-bandwidth absorbing material.

4. The apparatus of claim 1, wherein the nano-electronic circuits comprise one or more of carbon nanotube (CNT), graphene field-effect transistor (FET) based, or organic FET based electronic circuits, wherein the nano-electronic circuits comprise unit cells and a first portion of multiplexer circuits implemented at least partially with CNT field effect transistors, and wherein the unit cells comprise trans-impedance amplifiers, buffer circuits, and analog-to-digital (A/D) circuits.

5. The apparatus of claim 1, wherein the BE electronic circuits comprise CMOS electronics and the substrate comprises a semiconductor substrate including silicon, GaAs, GaN, or a flexible substrate, and wherein the CMOS electronics comprises a second portion of the multiplexer circuits.

6. The apparatus of claim 1, wherein the plurality of electrically conductive bump bonds comprise indium bump bonds, and wherein the count of the plurality of electrically conductive bumps is proportional to a square root of the count of the infrared imaging pixels of the array.

7. The apparatus of claim 6, wherein a 100 million pixel array is implemented with approximately 20,000 bump bonds, and the smallest size of a pixel of the array of infrared imaging pixels is not limited by the size of the smallest bump bond.

8. The apparatus of claim 1, wherein the nano-electronic circuits are implemented in a vertically stacked structure with multiple devices including one or more of carbon nano-tube (CNT) field-effect transistor (FET), graphene FET, or organic FET based devices stacked on top of one another.

9. A method for providing a hybrid infrared focal plane array, the method comprising:
    providing a front-end (FE) portion comprising nano-electronic circuits integrated with an array of infrared imaging pixels and generating multiplexed output signals; and
    providing a back-end (BE) portion comprising electronic circuits implemented on a substrate and generating readout output signals; and
    coupling the FE portion to the BE portion via a plurality of electrically conductive bump bonds, wherein a count of the plurality of electrically conductive bumps is substantially less than a count of the infrared imaging pixels of the array.

10. The method of claim 9, wherein providing the FE portion comprises providing an infrared absorbing material comprising one or more of mercury-cadmium-telluride (MCT), indium antimonide (InSb), or sodium lauryl sulfate (SLS).

11. The method of claim 10, wherein the infrared absorbing material comprises a bi-color absorbing material, and wherein the infrared absorbing material comprises a dual-bandwidth absorbing material.

12. The method of claim 9, wherein providing the FE portion comprises providing unit cells and a first portion of multiplexer circuits that are implemented at least partially with nano-electronic materials including one or more of carbon nanotube (CNT) field effect transistor (FET), graphene FET, or organic FET based devices, and wherein providing the unit cells comprises providing trans-impedance amplifiers, buffer circuits, and analog-to-digital (A/D) circuits.

13. The method of claim 9, wherein providing the BE portion comprises providing CMOS electronics, wherein the substrate comprises a semiconductor substrate including silicon, GaAs, GaN, or a flexible substrate, and wherein the CMOS electronics comprised a second portion of the multiplexer circuits.

14. The method of claim 9, wherein coupling the FE portion to the BE portion comprises using a plurality of indium bump bonds, and wherein coupling an array of infrared imaging pixels with $N^2$ pixels to the BE portion comprised using approximately N indium bump bonds.

15. The method of claim 9, wherein a 100 million pixel array is implemented with approximately 20,000 bump bonds, and the smallest size of a pixel of the array of infrared imaging pixels is limited by an available technology rather than the size of the smallest bump bond.

16. The method of claim 9, further comprising implementing the nano-electronic circuits in a vertically stacked structure with multiple devices including one or more of carbon nanotube (CNT) field-effect transistor (FET), graphene FET, or organic FET based devices stacked on top of one another.

17. A device for infrared imaging, the device comprising:
an infrared focal plane array (IRFPA) integrated with nano-electronic circuits forming a front-end (FE) plane and configured to generate multiplexed output signals corresponding to a plurality of pixels;
a CMOS electronic circuit back-end (BE) plane configured to receive the multiplexed output signals and to generate readout output signals; and
a plurality of electrically conductive bump bonds configured to couple the FE plane to the BE plane,
wherein the count of the plurality of electrically conductive bumps is proportional to a square root of the count of the plurality of pixels.

18. The device of claim 17, wherein the nano-electronic circuits comprise unit cells and a first portion of multiplexer circuits implemented at least partially with nano-electronic materials including one or more of carbon nanotube (CNT) field effect transistors (FETs), graphene FETs, or organic FETs, and wherein the unit cells comprise trans-impedance amplifiers, buffer circuits and analog-to-digital (A/D) circuits.

19. The device of claim 18, wherein the CMOS electronic circuit back-end (BE) plane is implemented on a substrate, wherein the substrate comprises a semiconductor substrate including silicon, GaAs, GaN, or a flexible substrate, and wherein the CMOS electronic circuit back-end (BE) plane comprises a second portion of the multiplexer circuits.

20. The device of claim 17, wherein the plurality of electrically conductive bump bonds comprise indium bump bonds, wherein the smallest size of a pixel of the plurality of pixels is not limited by the size of the smallest bump bond, and wherein the nano-electronic circuits are implemented in a vertically stacked structure with multiple devices including one or more of carbon nanotube (CNT) field-effect transistor (FET), graphene FET, or organic FET based devices stacked on top of one another.

* * * * *